United States Patent
Chen et al.

(10) Patent No.: US 11,142,690 B2
(45) Date of Patent: Oct. 12, 2021

(54) BLUE FLUORESCENT POWDER FOR THREE PRIMARY COLOR WARM WHITE LIGHT LED AND PREPARATION METHOD THEREFOR

(71) Applicant: Xiamen University, Fujian (CN)

(72) Inventors: Chao Chen, Fujian (CN); Xing Yang, Fujian (CN); Jiachao Chen, Fujian (CN); Yang Li, Fujian (CN)

(73) Assignee: Xiamen University, Fujian (CN)

( * ) Notice: Subject to any disclaimer, the term of this patent is extended or adjusted under 35 U.S.C. 154(b) by 0 days.

(21) Appl. No.: 16/956,670

(22) PCT Filed: Dec. 21, 2018

(86) PCT No.: PCT/CN2018/122504
§ 371 (c)(1),
(2) Date: Sep. 16, 2020

(87) PCT Pub. No.: WO2019/120265
PCT Pub. Date: Jun. 27, 2019

(65) Prior Publication Data
US 2021/0009898 A1  Jan. 14, 2021

(30) Foreign Application Priority Data
Dec. 22, 2017 (CN) .......................... 201711405544.6

(51) Int. Cl.
C09K 11/77 (2006.01)
H01L 33/50 (2010.01)

(52) U.S. Cl.
CPC ........ C09K 11/7739 (2013.01); C09K 11/774 (2013.01); H01L 33/504 (2013.01)

(58) Field of Classification Search
CPC .......................... C09K 11/774; C09K 11/7739
See application file for complete search history.

(56) References Cited

U.S. PATENT DOCUMENTS 4,565,948 A * 1/1986 Kimura ................... H01J 61/44
252/301.4 F

FOREIGN PATENT DOCUMENTS

| CN | 1546606 A | 11/2004 |
|---|---|---|
| CN | 106634997 A | 5/2017 |
| JP | 55-15489 | * 9/1980 |

OTHER PUBLICATIONS

International Search Report with English Translation, cited in PCT/CN2018/122504 dated Mar. 27, 2019, 5 pages.

* cited by examiner

*Primary Examiner* — C Melissa Koslow
(74) *Attorney, Agent, or Firm* — Cooper Legal Group, LLC

(57) ABSTRACT

The present disclosure discloses a blue fluorescent powder for a three primary color warm white LED and a preparation method thereof. $SrCO_3$, $NH_4Cl$, $H_3BO_3$, $Eu_2O_3$, and $NH_4H_2PO_4$ function as raw materials to obtain a chemical formula of a blue fluorescent powder $Sr_{(2-x)}Eu_x(BO_3)_y(PO_4)_{(1-y)}Cl$ in a reducing atmosphere by a solid-state sintering method, wherein $0.001 \leq x \leq 0.1$ and $0.001 \leq y \leq 0.5$. The blue fluorescent powder is mixed with $CaAlSiN_3:Eu^{2+}$ red fluorescent powder and $(SrBa)_2SiO_4:Eu^{2+}$ green fluorescent powder at a certain proportion to emit warm white light with a light efficiency and a color rendering index under a violet light excitation. An application prospect is wide.

13 Claims, 2 Drawing Sheets

BLUE FLUORESCENT POWDER FOR THREE PRIMARY COLOR WARM WHITE LIGHT LED AND PREPARATION METHOD THEREFOR

FIELD OF THE DISCLOSURE

The present disclosure relates to a luminescent material and a preparation method thereof, and in particular relates to a blue fluorescent powder for a three primary color warm white light-emitting diode (LED) and a preparation method thereof.

BACKGROUND OF THE DISCLOSURE

The global energy crisis has resulted in a strategic plan for national development of white LED lighting. With the starting of a national semiconductor lighting project, the "Eleventh Five-Year Plan" has provided a lot of financial support, and rare earth fluorescent powders for white LEDs are plentiful in our country. With an establishment of intellectual property rights, our country will quickly enter the lighting market for white LEDs.

The promotion of LED lighting not only benefits sustainable development of the society and the environment, but also can promote related industries, enhance competitiveness of the lighting industry in our country, develop a number of emerging internationally competitive industries with independent intellectual property rights, increase employment opportunities, and provide a strong potential competitor that can replace traditional lighting in the future, which is meaningful for energy-saving, an upgrade of the lighting industry, and the development of new manufacturing industries.

At present, one way to achieve high luminous efficiency white light emission is to use a blue chip to excite yellow fluorescent powders. The most mature yellow fluorescent powders are mainly yttrium aluminum garnet doped with $Ce^{3+}$ (YAG:$Ce^{3+}$), which can be effectively excited by a blue light LED chip at 440-480 nm and is complementary with the blue light to synthesize white light. However, the light emission has some disadvantages, such as for example, poor color reproduction, low color rendering indexes, and it is difficult to generate warm colors. In recent years, there have also been some reports of white fluorescent powders having single base function phosphor materials for the white LEDs; however, most are cold white light. Even in cases where there are some warm white fluorescent powders, at least two rare earth ions or elements are doped in the base to achieve luminescence, which not only increases the cost of the fluorescent powders, but also this indirect excitation directly leads to serious energy loss, and a final luminous efficiency of the fluorescent powders is relatively low. Near-ultraviolet or violet chips are used to excite three primary color fluorescent powders, the development cost is lower, the luminous efficiency is high, and performances of the warm white fluorescent powders are more significant. This is very important for promoting development, promotion, and application of the warm white LEDs in the art.

BRIEF SUMMARY OF THE DISCLOSURE

An objective of the present disclosure is to provide a blue fluorescent powder for a warm white LED and a preparation method thereof.

In order to achieve the objective, a technical solution is as follows.

A blue fluorescent powder for a three primary color warm white LED, a chemical formula of the blue fluorescent powder is $Sr_{(2-x)}Eu_x(BO_3)_y(PO_4)_{(1-y)}Cl$, wherein $0.001 \leq x \leq 0.1$ and $0.001 \leq y \leq 0.5$.

The chemical formula of the blue fluorescent powder for the warm white LED of the present disclosure is preferably $Sr_{1.95}Eu_{0.05}(BO_3)_{0.25}(PO_4)_{0.75}Cl$.

In an embodiment, the chemical formula of the blue fluorescent powder for the warm white LED of the present disclosure is preferably $Sr_{1.99}Eu_{0.01}(BO_3)_{0.25}(PO_4)_{0.75}Cl$.

A method for preparing a blue fluorescent powder for a three primary color warm white LED comprises the following steps:

(a) weighing raw materials $SrCO_3$, $NH_4Cl$, $H_3BO_3$, $Eu_2O_3$, and $NH_4H_2PO_4$ according to a molar ratio of each element of a chemical formula with $Sr_{(2-x)}Eu_x(BO_3)_y(PO_4)_{(1-y)}Cl$ of the blue fluorescent powder, mixing, and grinding to obtain a mixture, wherein in the chemical formula, $0.001 \leq x \leq 0.1$ and $0.001 \leq y \leq 0.5$;

(b) placing the mixture in a reducing atmosphere, heating up to 900-1150° C., and roasting for 4-5 hours to obtain a sintered body; and (c) cooling the sintered body to room temperature and grinding to obtain a blue fluorescent powder for the three primary color warm white LED.

In the method for preparing the blue fluorescent powder for the warm white LED of the present disclosure, the chemical formula of step (a) is preferably x=0.05 and y=0.25. A blue light intensity of the fluorescent powder prepared in the preferred conditions is high, and when the fluorescent powder is mixed with a commercial green powder and a commercial red powder, a warm white light with a high efficiency and a high color rendering index is obtained.

In the method for preparing the blue fluorescent powder for the warm white LED of the present disclosure, in step (a), a time for the grinding is 10-20 minutes.

In the method for preparing the fluorescent powder for the warm white LED of the present disclosure, in step (b), a heating rate is 3-7° C./min.

In the method for preparing the blue fluorescent powder for the warm white LED of the present disclosure, in step (b), the reducing atmosphere is a reducing atmosphere formed by mixed gas of $H_2$ and $N_2$ or being embedded in carbon powder.

In the method for preparing the blue fluorescent powder for the warm white LED of the present disclosure, step (b) preferably comprises heating up to 900-1150° C. and roasting for 5 hours. Preferably, roasting at 1050° C. for 5 hours.

The present disclosure has the following advantages.

Optical properties of the luminescent material prepared by the present disclosure were tested. When the color rendering index is more than 90, light efficiency of the luminescent material is up to 86.7 lm/W, even up to 104 lm/W.

DETAILED DESCRIPTION OF THE EMBODIMENTS

The present disclosure will be further described below with the accompanying embodiments. However, the present disclosure is not limited to the embodiments in any way. Unless otherwise specified, reagents, methods, equipment of the present disclosure are conventional reagents, methods, and equipment of the technical art. However, the present disclosure is not limited in any way.

Embodiment 1

Figure 1:
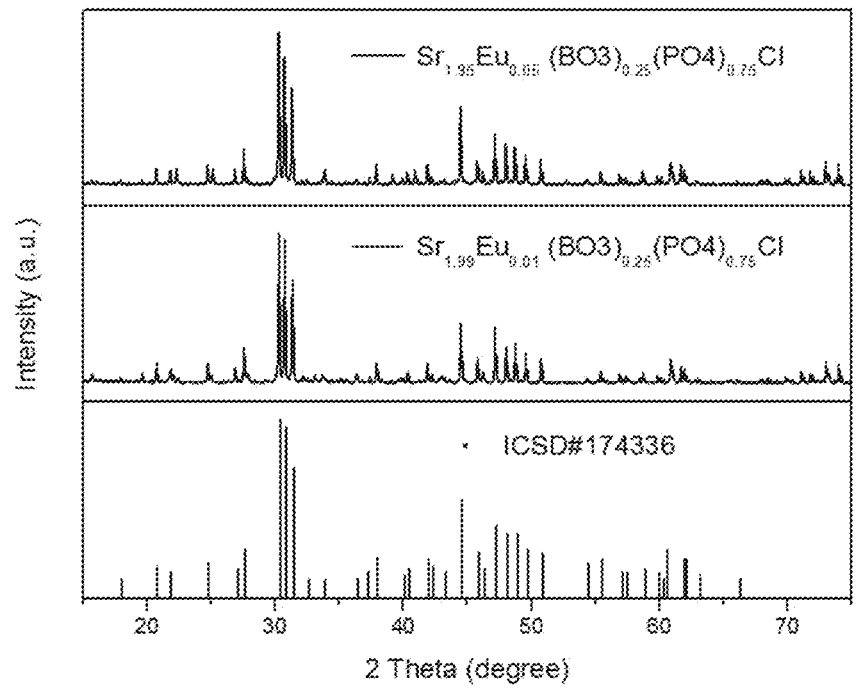
FIG. 1 is X-ray diffraction spectra (XRD) of a blue fluorescent powder prepared in Embodiment 1 and Embodiment 2.

Weighing 1.406 g of strontium carbonate ($SrCO_3$), 0.268 g of anhydrous ammonium chloride ($NH_4Cl$), 0.062 g of boric acid ($H_3BO_3$), 0.088 g of europium trioxide ($Eu_2O_3$), and 0.371 g of ammonium dihydrogen phosphate ($NH_4H_2PO_4$), putting into an agate mortar, grinding for 30 minutes, and mixing evenly. Roasting the grinded powder in a reducing atmosphere, heating to 1000° C. at a heating rate of 5° C./min, sintering (using a solid-phase sintering method) at the temperature for 6 hours, and then naturally cooling to room temperature (e.g., 20° C.-25° C.). Taking the sample out and grinding to obtain a fluorescent powder with a chemical formula of $Sr_{1.95}Eu_{0.05}(BO_3)_{0.25}(PO_4)_{0.75}Cl$. An X-ray diffraction spectrum (XRD) of the fluorescent powder is shown in FIG. 1.

The raw materials, $SrCO_3$ Analytical Reagent (A.R.), $NH_4Cl$ (A.R.), $H_3BO_3$ (A.R.), $Eu_2O_3$ (99.99 wt %), and $NH_4H_2PO_4$ (A.R.), of the Embodiment of the present disclosure are all commercially available products.

Mixing the prepared $Sr_{1.95}Eu_{0.05}(BO_3)_{0.25}(PO_4)_{0.75}Cl$ fluorescent powder with $CaAlSiN_3:Eu^{2+}$ red fluorescent powder and $(SrBa)_2SiO_4:Eu^{2+}$ green fluorescent powder at a certain proportion under violet light excitation (near ultraviolet light) and coating on an InGaN LED chip with an emission wavelength of 395 nm and an operating current of 350 mA to emit warm white light with a color temperature of 3153K. An optical performance of the luminescent material prepared in the embodiment was tested. When the color rendering index is more than 90, the light efficiency is up to 86.7 lm/W.

Figure 2:
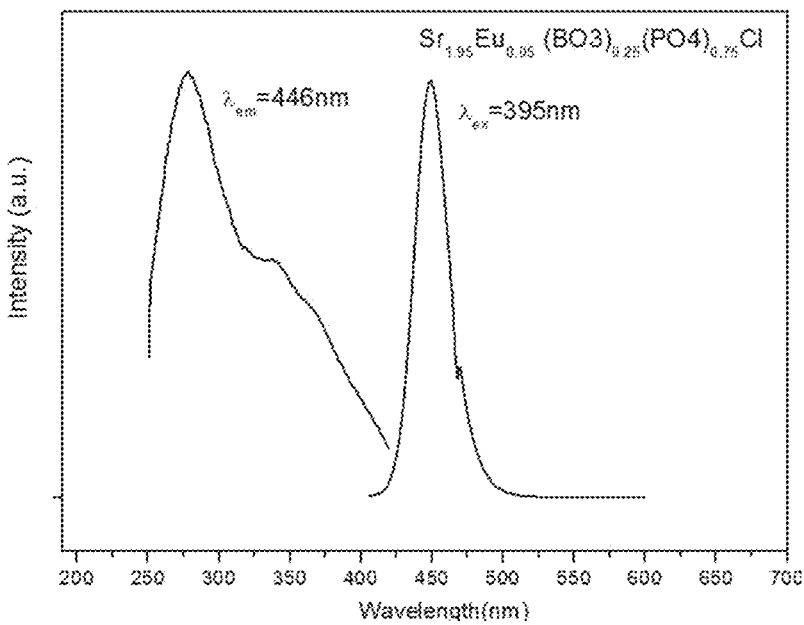
FIG. 2 is an excitation spectrum and an emission spectrum of the blue fluorescent powder prepared in Embodiment 1, wherein an excitation wavelength $\lambda ex = 395$ nm and an emission wavelength $\lambda em = 446$ nm.
Figure 3:
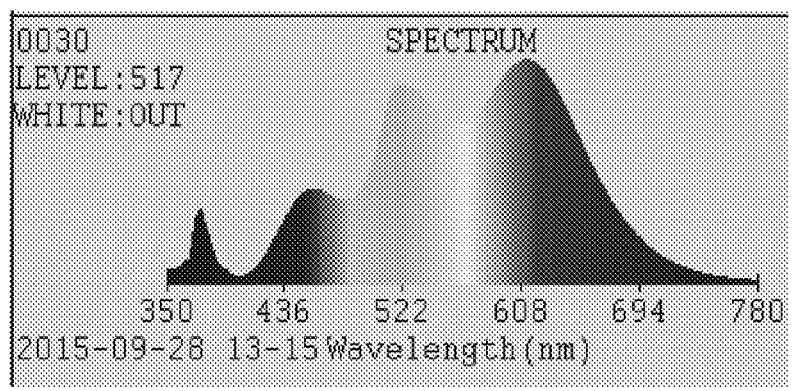
FIG. 3 is an emission spectrum of a three primary color warm white fluorescent powder prepared in Embodiment 1, wherein an excitation wavelength is 395 nm.
Figure 4:
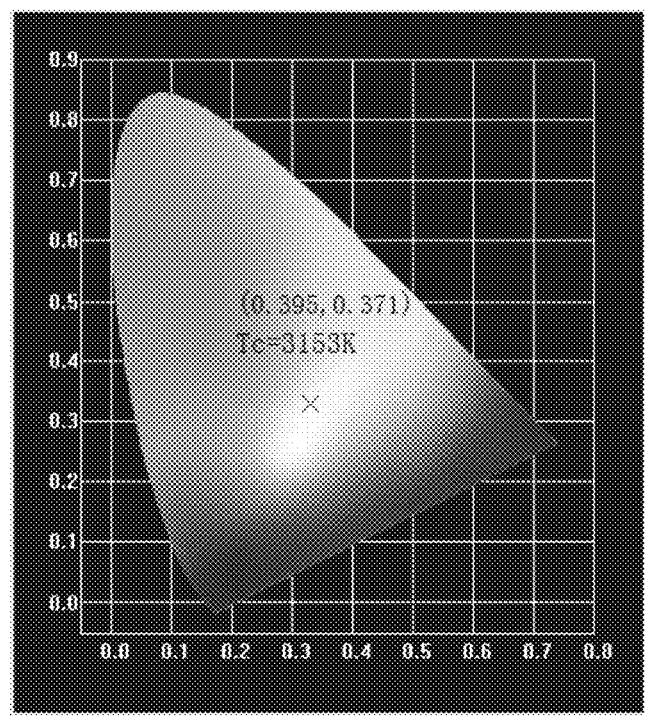
FIG. 4 is a luminescence spectrum and a color coordinate graph of a three primary color warm white light-emitting diode (LED) prepared in Embodiment 1 when under a near ultraviolet light excitation.

The results are shown in FIGS. 2 to 4.

Embodiment 2

Embodiment 2 is basically the same as Embodiment 1 except that a chemical formula of a prepared fluorescent powder is different. An X-ray diffraction spectrum (XRD) is shown in FIG. 1.

1.465 g of strontium carbonate ($SrCO_3$), 0.268 g of anhydrous ammonium chloride ($NH_4Cl$), 0.062 g of boric acid ($H_3BO_3$), 0.018 g of europium trioxide ($Eu_2O_3$), and 0.371 g of ammonium dihydrogen phosphate ($NH_4H_2PO_4$) was weighed, was put into an agate mortar, and then was ground for 30 minutes to mix evenly. The ground powder was roasted in a reducing atmosphere and was heated to 1000° C. at a heating rate of 5° C./min, was sintered at this temperature for 6 hours, and then was naturally cooled to room temperature (e.g., 20° C.-25° C.). The sample was taken out and was ground to obtain a fluorescent powder with the chemical formula $Sr_{1.99}Eu_{0.01}(BO_3)_{0.25}(PO_4)_{0.75}Cl$.

The aforementioned embodiments are preferred embodiments. However, embodiments of the present disclosure are not limited to the aforementioned embodiments. Any modifications, variations, combinations, and simplifications without departing from the spirit or scope of the present disclosure are all equivalents to come within the scope of the appended claims and their equivalents.

What is claimed is:

1. A blue fluorescent powder for a three primary color warm white light-emitting diode (LED), wherein a chemical formula of the blue fluorescent powder is $Sr_{(2-x)}Eu_x(BO_3)_y(PO_4)_{(1-y)}Cl$, wherein $0.001 \leq x \leq 0.1$ and $0.001 \leq y \leq 0.5$.

2. The blue fluorescent powder for the three primary color warm white LED according to claim 1, wherein the chemical formula of the blue fluorescent powder is $Sr_{1.95}Eu_{0.05}(BO_3)_{0.25}(PO_4)_{0.75}Cl$.

3. The blue fluorescent powder for the three primary color warm white LED according to claim 1, wherein the chemical formula of the blue fluorescent powder is $Sr_{1.99}Eu_{0.01}(BO_3)_{0.25}(PO_4)_{0.75}Cl$.

4. A method for preparing a blue fluorescent powder for a three primary color warm white LED comprising:
   (a) weighing raw materials $SrCO_3$, $NH_4Cl$, $H_3BO_3$, $Eu_2O_3$, and $NH_4H_2PO_4$ according to a molar ratio of each element of a chemical formula with $Sr_{(2-x)}Eu_x(BO_3)_y(PO_4)_{(1-y)}Cl$ of the blue fluorescent powder, mixing, and grinding to obtain a mixture, wherein in the chemical formula, $0.001 \leq x \leq 0.1$ and $0.001 \leq y \leq 0.5$;
   (b) placing the mixture in a reducing atmosphere, heating up to 900-1150° C., and roasting for 4-5 hours to obtain a sintered body; and
   (c) cooling the sintered body to room temperature and grinding to obtain the blue fluorescent powder for the three primary color warm white LED.

5. The method for preparing the blue fluorescent powder for the three primary color warm white LED according to claim 4, wherein in step (a), in the chemical formula, x=0.05 and y=0.25.

6. The method for preparing the blue fluorescent powder for the three primary color warm white LED according to claim 4, wherein in step (a), a time of the grinding is 10-20 minutes.

7. The method for preparing the blue fluorescent powder for the three primary color warm white LED according to claim 4, wherein in step (b), a heating rate is 3-7° C./min.

8. The method for preparing the blue fluorescent powder for the three primary color warm white LED according to claim 4, wherein in step (b), the reducing atmosphere is a reducing atmosphere formed by mixed gas of $H_2$ and $N_2$ or is carbon powder and the mixture is embedded in the carbon powder.

9. The method for preparing the blue fluorescent powder for the three primary color warm white LED according to claim 4, wherein in step (b) roasting for 4-5 hours comprises roasting for 5 hours.

10. The method for preparing the blue fluorescent powder for the three primary color warm white LED according to claim 5, wherein in step (b), roasting for 4-5 hours comprises roasting for 5 hours.

11. The method for preparing the blue fluorescent powder for the three primary color warm white LED according to claim 6, wherein in step (b), roasting for 4-5 hours comprises roasting for 5 hours.

12. The method for preparing the blue fluorescent powder for the three primary color warm white LED according to claim 7, wherein in step (b), roasting for 4-5 hours comprises roasting for 5 hours.

13. The method for preparing the blue fluorescent powder for the three primary color warm white LED according to claim 8, wherein in step (b), roasting for 4-5 hours comprises roasting for 5 hours.

* * * * *